United States Patent [19]

Larrison

[11] 4,288,023
[45] Sep. 8, 1981

[54] PARTS STORAGE AND HANDLING SYSTEM

[75] Inventor: John E. Larrison, Costa Mesa, Calif.

[73] Assignee: Orthodyne Electronics, Costa Mesa, Calif.

[21] Appl. No.: 56,803

[22] Filed: Jul. 12, 1979

[51] Int. Cl.³ .............................................. B65G 1/06
[52] U.S. Cl. .................................... 228/110; 228/4.5; 228/47; 29/809; 198/655; 221/122
[58] Field of Search ...................... 228/47, 1, 4.5, 110, 228/179; 29/809, 810, 818; 414/331; 198/655; 221/119–122

[56] References Cited

U.S. PATENT DOCUMENTS

| | | | |
|---|---|---|---|
| 919,927 | 4/1909 | Neumann et al. | 221/121 |
| 2,817,429 | 12/1957 | Vanderslice et al. | 198/655 X |
| 3,051,026 | 8/1962 | Costa | 228/4.5 |
| 3,206,006 | 9/1965 | Meeder et al. | 198/793 X |
| 3,348,658 | 10/1967 | Cannon | 198/655 |
| 3,435,940 | 4/1969 | Seragnoli | 53/150 X |
| 3,838,791 | 10/1974 | Raitt | 221/119 X |

Primary Examiner—Howard N. Goldberg
Assistant Examiner—K. J. Ramsey
Attorney, Agent, or Firm—George F. Bethel; Patience K. Bethel

[57] ABSTRACT

The following specification discloses a parts handling and storage system that can be directed toward the handling and storage of electronic components. The storage portion comprises a movable cabinet on wheels having a plurality of elongated tubular members or channels that receive components or parts along the length thereof. The tubular members or channels are driven on a linked basis parallel to each other by a gear movement and chain drive. In this manner, the channels themselves in their linked relationship form a chain of axially elongated links. Each respective channel or tubular member can be indexed at a given point for exposing the parts therein, so that they can be moved therealong into an adjacent track or channel or other handling means. The storage cabinet and tubular channel members when combined with an extended track can be associated at the end of the track with a second storage cabinet for receiving the parts after they have been processed from the first storage cabinet. The processing of the parts can be at an intermediate location along the track between the two respective storage cabinets in the form of a processing unit such as a bonder, a wire test device, or other electronic or parts processing device. The entire combination of the storage cabinet, tracks and parts handling system can be combined to provide a complete system for storage of parts, processing and movement of parts from one station to another.

14 Claims, 13 Drawing Figures

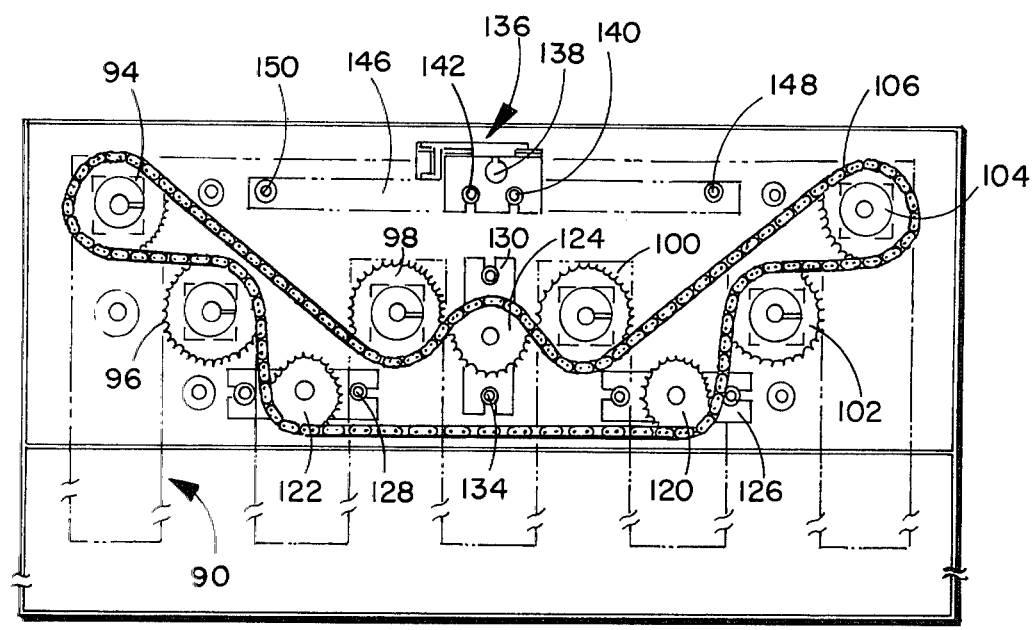
FIG. 3
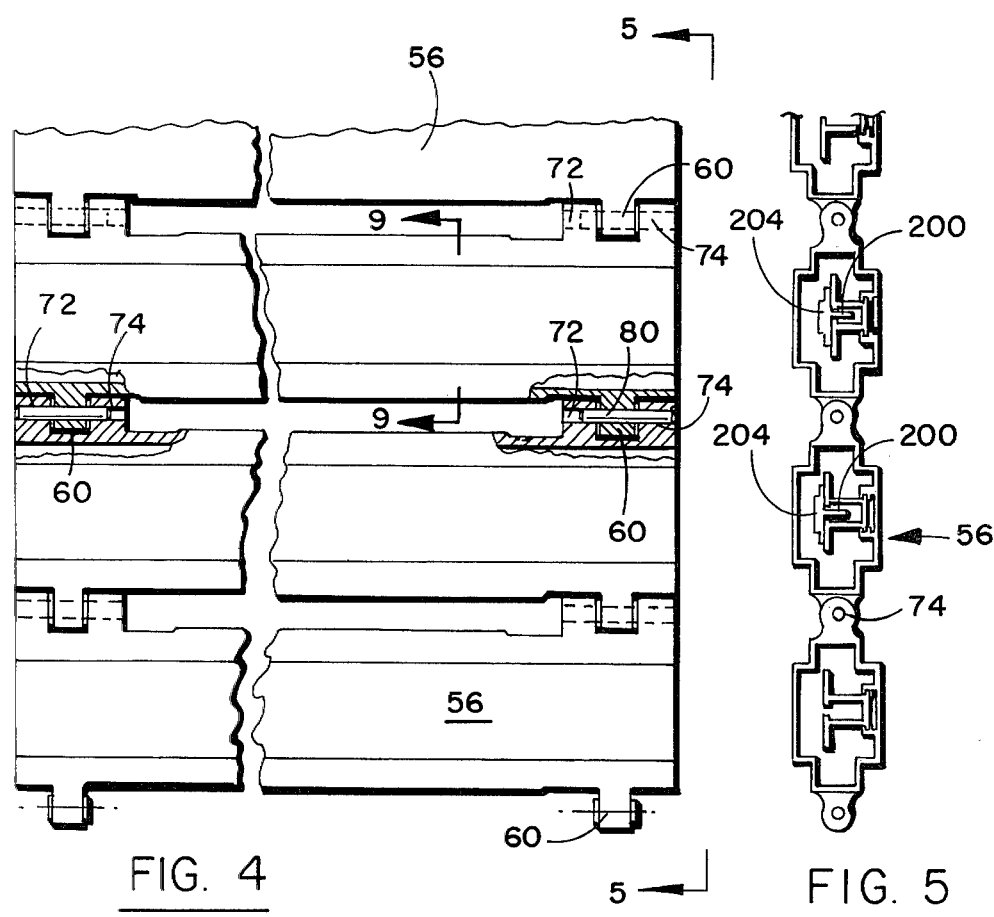
FIG. 4
FIG. 5

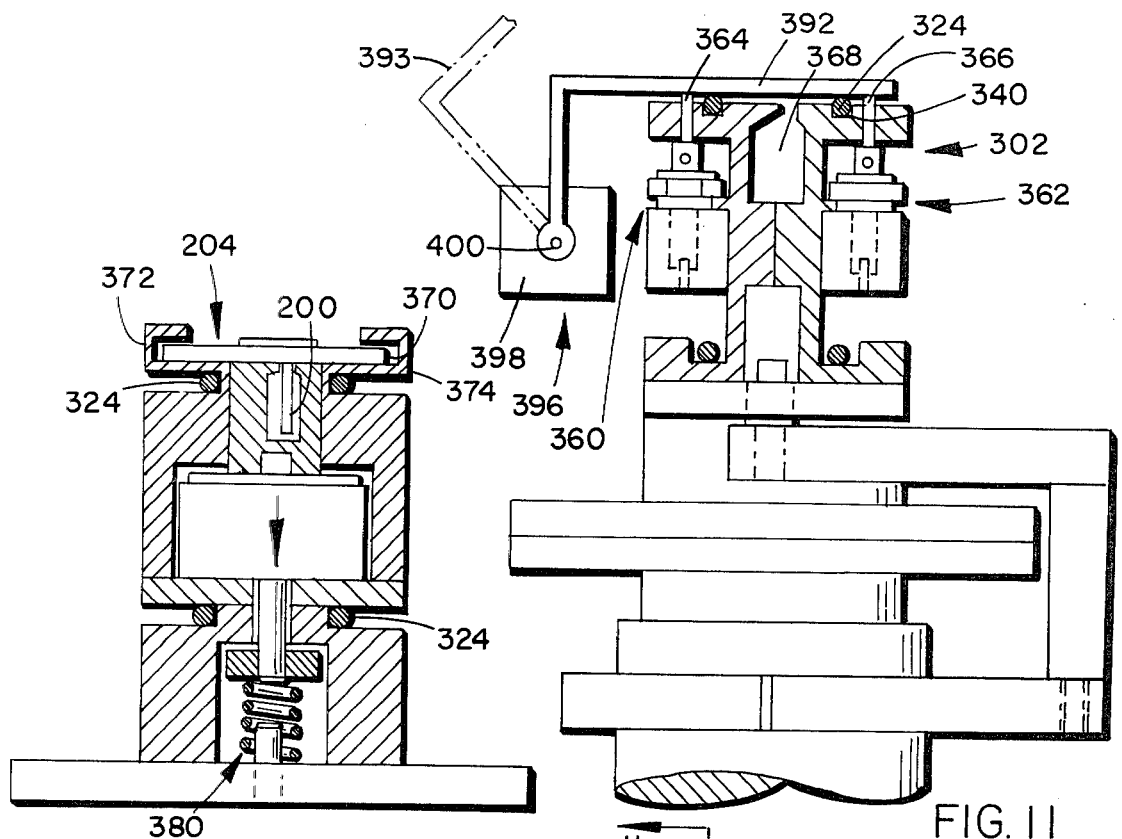
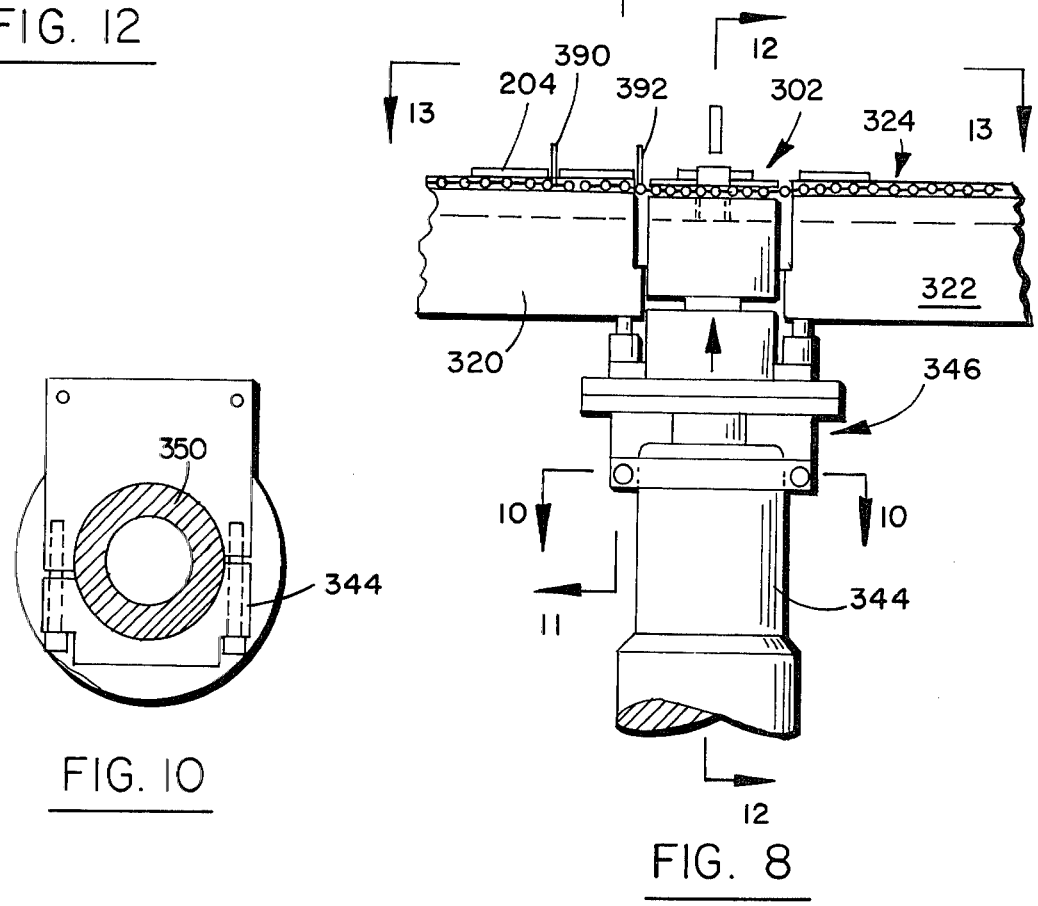
FIG. 12
FIG. 11
FIG. 10
FIG. 8

PARTS STORAGE AND HANDLING SYSTEM

BACKGROUND OF THE INVENTION

1. Field of the Invention

The field of this invention lies within the field of parts handling and storage as it relates to relatively small component parts. More particularly, it relates to the field of electronic parts handling, such as the handling and processing of electronic components in the form of semi-conductor circuits and components.

2. The Prior Art

The prior art with regard to parts handling and storage devices, particularly for electronic components, has been limited. Generally, the storage of such components and handling with regard to different stations, takes place in either massive parts fabrication and assembly processes in the initial fabrication of the parts, or on a discrete basis at a later point in time.

Between the two foregoing cases there is a necessity for handling parts on a discrete basis, yet with multiple parts storage means. For instance, in wire bonding of terminals through ultrasonic means when connecting wires and leads to parts, the parts are generally handled on a discrete basis. As can be appreciated, the handling of the parts in such a manner is tedious and a time consuming task.

In addition to the foregoing, after the parts have been handled, they need to be later stored or moved to another location. In electronic assembly, this is quite difficult unless the parts are all batched together in large boxes or by other means, such as racks. However, the large handling and rack storage has not facilitated the processing and handling of such components. As a consequence, it has deterred substantial activity in the fabrication and manufacture of electronic components and the assembly of circuits.

This invention overcomes the deficiencies of the prior art by providing a means for storing the electronic components and parts in a cart. The cart can be maintained with a clean and desirable environment. The cart with the components in the channels thereof can be readily delivered to a station wherein the components can be indexed to a take-off point and moved from the channels.

When the components have been indexed to a take-off point, the parts can then be driven from the cart and channel members. This can be accomplished by means of a flexible driver being driven along the channel, pushing the parts onto a track. After the parts have been moved along the track that is implaced in adjacent relationship to the channel, they can then be processed, such as in a wire bonding process, welding process such as an ultrasonic welding process, or other processes. Thereafter, the parts can then be moved along the track and restored in an analogous position in a cart with like storage channels, for later processing.

The entire storage and restorage is within channels that are analogous and identical for purposes of handling and therefore provide for adaptability so that the storage and restorage means can be both used interchangeably.

As a consequence, the foregoing invention substantially enhances the delivery, usage, storage and general handling of electronic parts, as well as other small parts. As will be seen from the following specification, this invention provides features which enhance and enable the storage of parts on a broad and general usage for processing thereof.

SUMMARY OF THE INVENTION

In summation, this invention comprises a small parts storage and handling system, wherein such parts are held in a plurality of movable tubular channels for the indexed removal thereof.

More particularly, the invention comprises a storage cabinet and support means for a plurality of tubular channels that are formed into a linked configuration along the edges of the tubular channels in side by side substantially parallel relationship. The movement of the tubular channels is effectuated by means of moving the tubular channels by means of a gear driven chain and Geneva movement connected to an indexing telemetry system. The chain drives sprockets that support the tubular channels in their parallel relationship. In this manner, the tubular channels move in side by side relationship wherein the elongated portion forms the axial portion of the links.

The tubular channels have slots therein that receive parts in end to end relationship therealong and are moved so as to expose the ends of said channels to openings within the side of the cabinet. The openings can be held in indexed relationship to an elongated track or other carrying means, so that when the parts are driven from the tubular channels, they can be delivered onto a track for processing at a point along the track by means of a wire bonding or ultrasonic bonding technique, or other fabrication process.

After the parts have been processed, they can be moved along the track and driven into an entrance opening of a tubular channel that has been indexed at the end of the track for purposes of storage therein. The tubular channel can be of the same type and identical configuration as the first series of tubular channels in turn supported on its cart. Thus, the parts can then be moved by the second cart to another station for later processing in an interchangeable manner with the first cart.

BRIEF DESCRIPTION OF THE DRAWINGS

The invention will be more clearly understood by reference to the description below taken in conjunction with the accompanying drawings wherein:

FIG. 3 shows an end view of the drive system for the tubular conduits which have been shown in diagramatic form;

FIG. 4 shows a partially sectioned plan view of the tubular conduits as laterally joined together in the direction of lines 4—4 of FIG. 2;

FIG. 5 shows an end view of the tubular conduits as shown in the direction of lines 5—5 of FIG. 4;

FIG. 8 shows a view of the processing head of the invention which is used for ultrasonic bonding in the direction of lines 8—8 of FIG. 1;

FIG. 10 shows a sectional view of the bonder as seen in the direction of lines 10—10 of FIG. 8;

FIG. 11 shows a view of the bonding head as shown in the direction of lines 11—11 of FIG. 8;

FIG. 12 shows a sectional view of the bonding head as seen in the direction of lines 12—12 of FIG. 8; and, FIG. 13 shows a plan view of the track and head as seen in the direction of lines 13—13 of FIG. 8.

DESCRIPTION OF THE PREFERRED EMBODIMENTS

Figure 9:
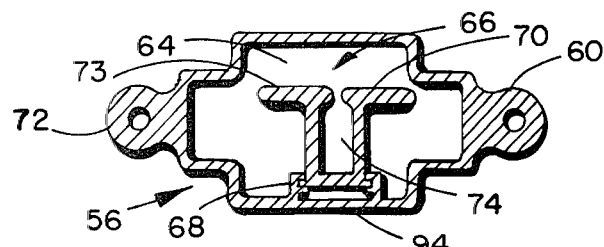
FIG. 9 shows a sectional view in the direction of lines 9—9 of the tubular conduit.
Figure 1:
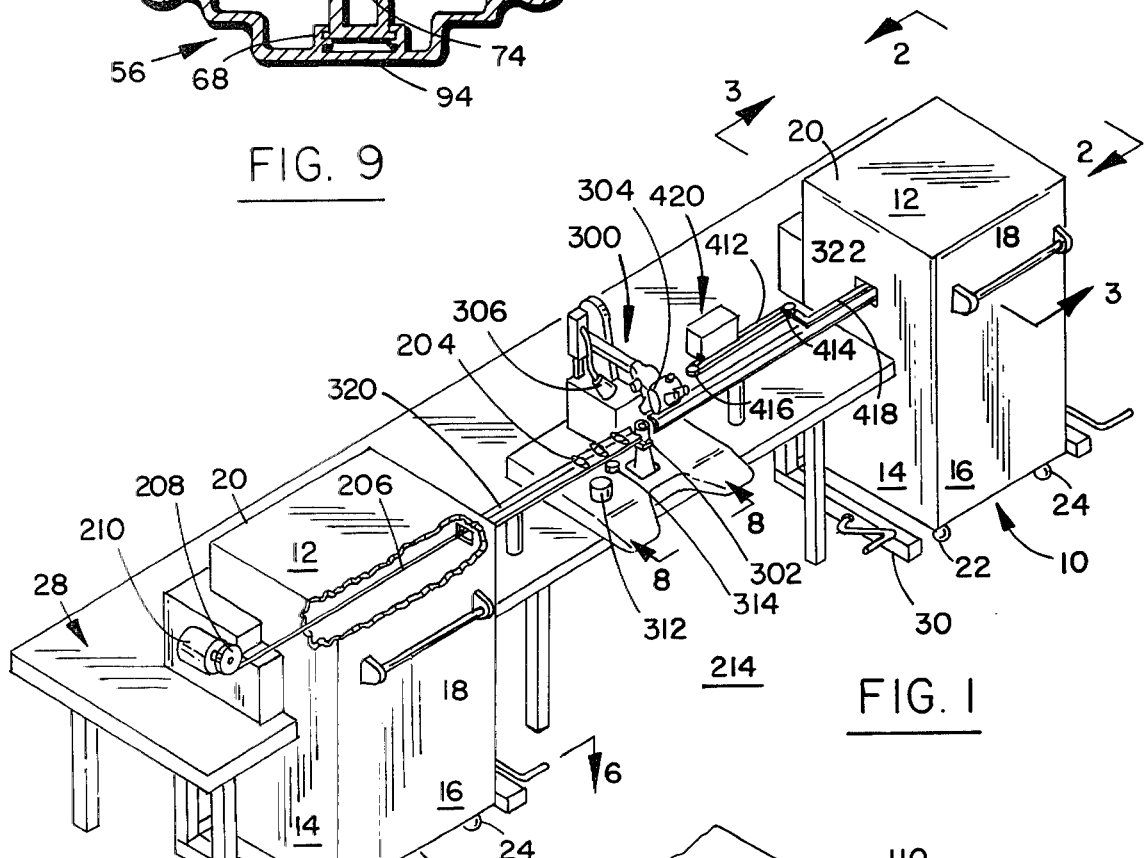
FIG. 1 shows a perspective view of the entire system, including two storage and transfer cabinets with the tubular channel conduits therein.

Looking particularly at FIG. 1, and the figures derived therefrom, it can be seen that a pair of cabinets 10 of like configuration have been shown. The cabinets 10 are generally comprised of a cabinet and framework which supports an outer top 12, side walls 14 and a back portion 16 to which a push-handle 18 is connected. The front portion of the cabinet 20 is similar to the rear portion 16 as far as the front panel features thereof.

The cabinets 10 are provided with casters or rollers 22 and 24 at the rear with balanced and similar rollers at the front thereof.

For purposes of explanation, the cabinets 10 are implaced within receptacle areas in a table 28. The table 28 is supported by legs in appropriate places and serves to receive the cabinets 10 within certain indented stations in the framework thereof. The cabinets 10 as will be described hereinafter, have the ability to store and feed parts therefrom in a manner to be described.

In order to index and hold the cabinets 10 in their respective locations, a framework 30 is shown at the base of the table 28. The framework 30 comprises upstanding members 32 and 34 with laterally oriented members 36 and 38. The laterally oriented members 36 and 38 have a cross member 40 thereacross with a hook 42 pivotally connected at point 44.

The pivotal hook 42 is such that it pivots backwardly and forwardly from the position shown in the dotted configuration. In doing this, it engages a pin 45 of the cart and holds it securely in a manner so that the cart is driven into the framework and against the table 28 in the indented portions. The hook 42 is actuated by means of a lever or crank arm 46 for movement in one direction and by a second crank arm 48 for movement in the other direction. The crank arms are interconnected in a ninety degree offset relationship by means of a cable 50 which moves backwardly and forwardly for purposes of moving the hook 42 rotationally inwardly and outwardly from the solid to the dotted configuration.

Any suitable means can be utilized for purposes of moving the cable 50 which has been connected to the crank arms 46 and 48 at the respective pivot points 47 and 49. Nevertheless, the foregoing allows for a connected locking and implacement of the cabinets 10 into their respective locations for indexing the tubular channelled conduits to be described hereinafter.

Figure 2:
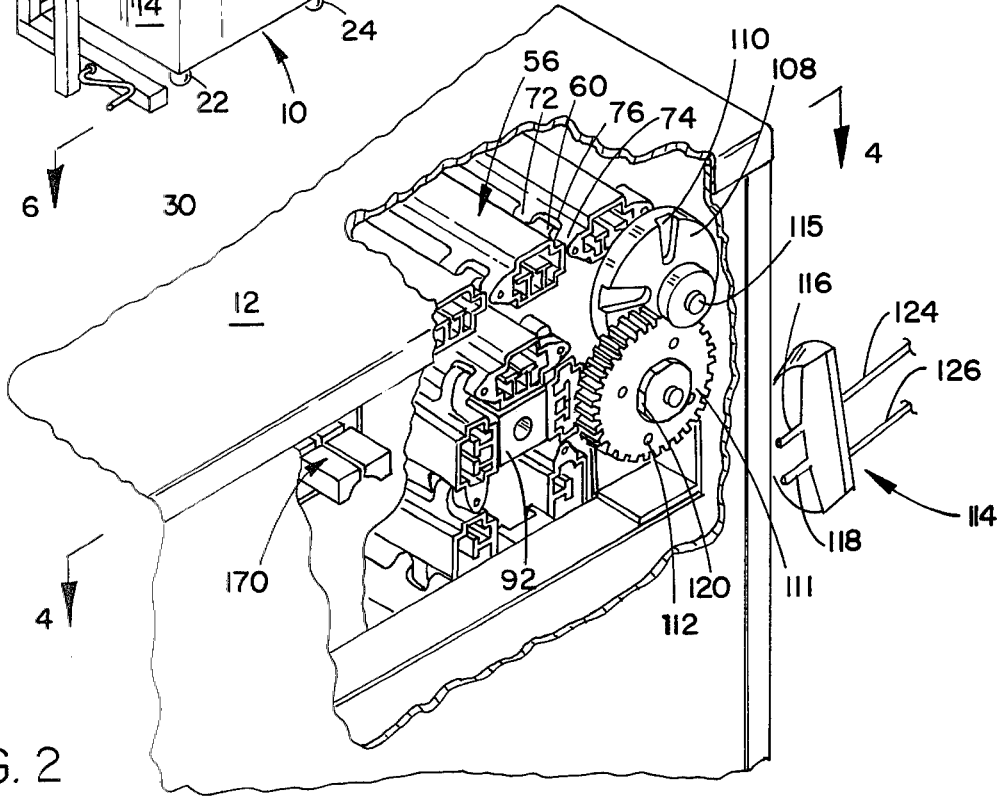
FIG. 2 shows a fragmented end view with a portion of the tubular conduits exposed in perspective view in the direction of lines 2—2 of FIG. 1.
Figure 6:
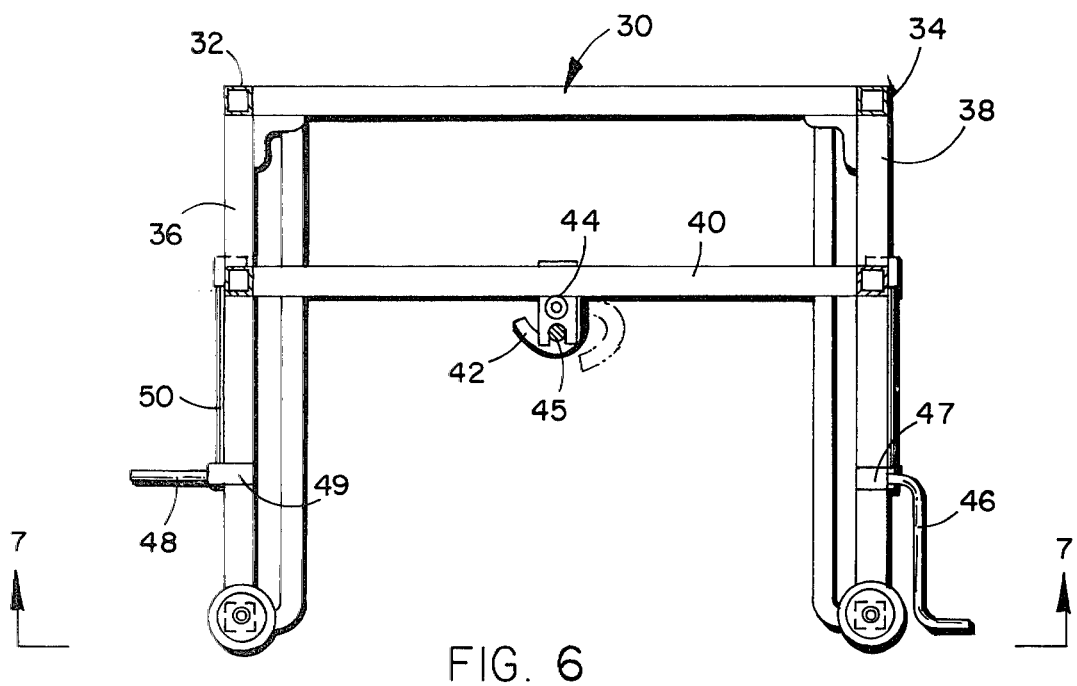
FIG. 6 shows the securement means for holding a cart with the tubular members in place within the system as taken in plan view in the direction of lines 6—6 of FIG. 1.
Figure 7:
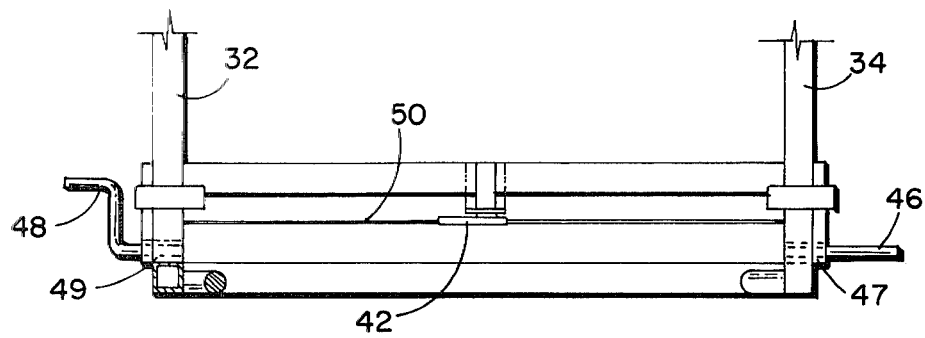
FIG. 7 shows an end view of the means for locking the movable cabinet in place as seen in the direction of lines 7—7 of FIG. 6.

Looking more particularly at FIG. 2 and the respective figures related thereto, namely FIGS. 3, 4, 5 and 9, it can be seen that the cabinet 10 has a plurality of tubular channels or conduits 56 therein. The tubular members or conduits which can be generally referred to as feeder tubes, are formed from an extrusion having two elongated ears 60 and 72. These ears can be formed so as to provide hinges in a manner to be described. The conduit 56 is provided with an interior channel opening 64 having an extended passage therethrough. The opening 64 is provided with a track 66 which can be keyed into or formed with a base member 68. The track 66 has two support surfaces 70 and 73 with an opening 74 therein to allow for the legs of a part to extend into the opening 74 and move along the surfaces 70 and 73.

The entire track 66 is formed in the shape of a U with a base that can be keyed into a slotted member 68 having a slot formed therein. The entire extrusion can be made with the tracks 70 and 73 formed as an integral member, or formed in the keyed manner as previously described. Regardless of the foregoing, the function is to allow for parts to be stored on the track 66 and moved therealong in the manner to be described hereinafter.

The ears 60 and 72 can be milled out of the extrusion to provide hinge points by means of outside hinge portions 72 and 74 with an internal slot 76 therein to receive a milled portion of the ear 60. The foregoing ears 60 and the outer hinge portions 72 and 74 can be milled or cut from the tubular extruded conduit stock as it exists. The remaining portion of the extruded stock of the ears 60 and 72 beyond the hinge point can be milled therefrom to allow for a hinged relationship and sufficient tolerances and clearances.

Looking more particularly at the figures, it can be seen that the hinge points are secured by a pin 80 as shown in FIG. 4. The pin is driven through the respective outer hinge points 72 and 74 for purposes of receiving the inner hinge portion or ear 60.

Regardless of whatever configuration is used, it should be understood that various channelled hinged embodiments can be utilized, so long as the tubes forming the channels form the same elongated channels in linked relationship. In other words, so long as the tubular members 56 move with respect to each other in a hinged parallel manner to allow for movement over a rotating holder or sprocket as described hereinafter, the linkage is sufficient. In other words, fingers, interconnecting webs or other hinging systems can be evolved for linking the channelled members 56.

Looking more particularly at the tubular members 56 as they are arranged in their pivotal relationship along hinge points 72, 74 and 76, it can be ssen that they are linked in the manner shown in FIG. 3. The interconnection is by the hinge points joining them in the coupled chain configuration generally defined by the lines 90 that shows a continuous linkage of the tubular members 56. The tubular members 56 in their linked configuration are driven over a rectangular or square drive sprocket 92 which tends to move the tubular members along the outer surface thereof by virtue of the fact that the tubular members have a surface width 94 approximately the same size of the rectangular members 92 for rotational movement thereby.

The continuously linked tubes 56 are driven by gears 94, 96, 98, 100, 102 and 104 connected to the sprockets 92. These gears are turned by means of a chain 106 that is driven in an incremental manner by a Geneva drive wheel 108 having a plurality of slots 110 therein. The Geneva drive wheel 108 is driven by a gear 111 having four pins 112 that engage the slots 110 every quarter rotation for purposes of turning the Geneva wheel 108. The drive wheel 111 can be driven by a stepping motor connected thereto for purposes of turning the gear teeth of the wheel. It should be understood that various drive configurations can be utilized for purposes of turning the Geneva movement 108. Suffice it to say, any suitable means that will incrementally move the sprockets 92 one quarter turn or ninety degrees, or other increments such as sixty or forty five degrees for moving the tubular member 56 is sufficient.

In order to properly monitor the turning of the drive gear 111, so that the pins 112 do not overdrive the Geneva wheel beyond a certain point, a photo-optical sensor 114 is utilized. The photo-optical sensor has a pair of photo-optical members 116 and 118. One of them casts a beam on a plurality of reflective surfaces, such as mirrors 120 around the edge of the wheel and then allows a reflection back to the photo-optical sensor so that the output thereof is received on a pair of wires 124 and 126 for controlling the stepping motor which turns the drive gear 111.

In the foregoing manner, the support and drive sprockets 92 can be turned so that a tubular member traverses along the surface thereof in three stages by being received on one edge, and then being turned upright and afterwards being turned over toward the other edge.

In order to allow the chain 106 to be properly driven, it can be connected for incremental drive by the Geneva wheel 108. Thus, as it turns it drives the gears 94 through 104 as well as idler gears 120, 122 and 124. The idler gears and the other members are supported by movable brackets 126, 128 and 130. All of the foregoing brackets can be supported by bolts, such as bolts 134 that hold the brackets and allow for adjustment.

In order to store electronic parts within the tubular conduits 56 of the cabinet, they are driven into a parts receiver in the form of an opening and guide formed as a plate 136. The plate 136 has an opening 138 into which parts are guided and is adjusted by bolts 140 and 142 for indexing them with a respective tubular conduit 56 that is implaced in juxtaposition thereto. The entire guide can be adjusted by means of side members and front and rear members part of which are seen attached to a bracket 146 having screws 148 and 150 holding the bracket.

The parts are fed into the cabinet through the adjustable parts receiver 136 and can be fed out through a parts guide 170 on the other side, providing a track similar to the track surface 70 and 72 having the opening 74 therein. Regardless of how the parts are guided outwardly or inwardly, the fundamental proposition is to maintain a guide, such as guide 170 at the output or inlet portion and guide 136 at the other portion. A further consideration is the fact that the guides can be interchanged by virtue of changing the respective locations of the guide through any suitable manner. Furthermore, the two guides 136 and 170 can be alternately either input or output guides for moving parts, depending upon the direction in which the cabinet 10 is turned and the particular desired movement of parts and storage therein as to its orientation. The main thought is that the guides 136 and 170 must be respectively oriented to always receive the parts to or from them in whatever manner is deemed necessary from the tubular members and conduits 56.

The tubular conduits 56 can be supplied with parts in any suitable manner, so long as they are pushed along the internal portions of the open channel 66 therein. By pushing them along the internal portion of the channel 66, a movement thereof can be effectuated, so as to slide them on the surfaces 70 and 72.

Figure 13:
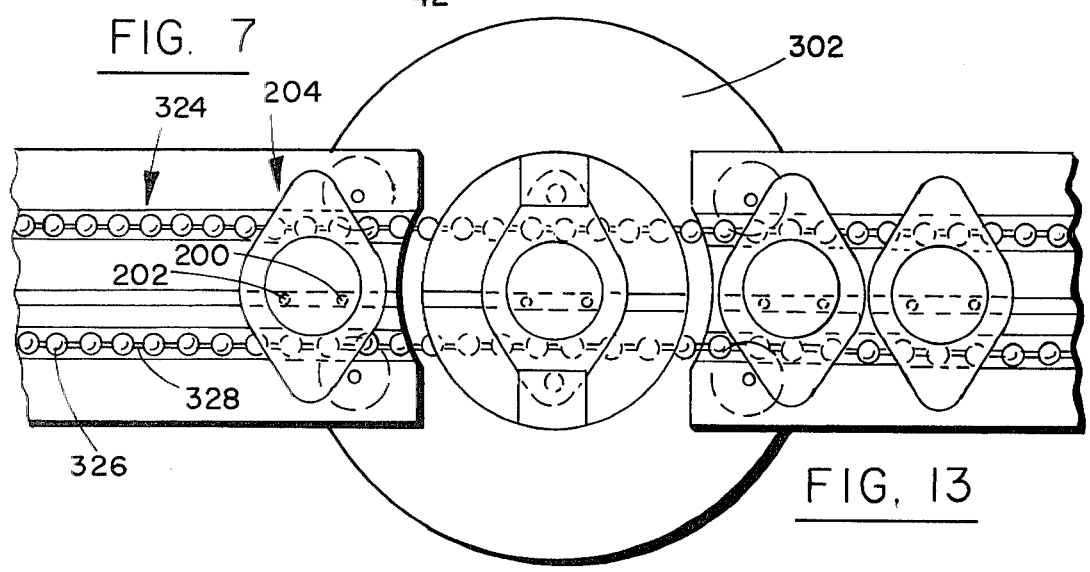

Looking more particularly at FIGS. 12 and 13, a part of the type contemplated hereunder can be seen having a pair of leads 200 and 202 with an upper portion 204. This type of semiconductor can be driven with the leads 200 and 202 in the opening 74 so as to effectuate guidance of the leads 200 and 202 within the opening 74 while resting the bottom surface of the upper portion 204 of the integrated circuit on the surfaces 70 and 72. However, it should be understood that various components and parts can be moved along the surfaces 70 and 72. Furthermore, the character of the opening 74 between the two respective surfaces 70 and 72 can be configured to receive any particular part. Furthermore, the surface 70 and 72 can be adapted to be configured with guides, channels, and surfaces to accommodate any particular part.

In this particular embodiment, in order to move the parts along the surfaces 70 and 72, an extended drive means such as a flexible tape 206 is shown in FIG. 1. The flexible tape 206 has been shown without the tubular members 56 therearound for purposes of illustration only. However, it should be understood that the flexible tape 206 drives through the opening of the channel 66 to remove the parts in a sliding manner along the surfaces 70 and 72. The tape 206 can be retracted and moved inwardly and outwardly along the conduit passage 66 by being rotated around a spool 208 turned by a motor 210. The motor 210 can have operator control from a station 214 in a manner to be described hereinafter. Also, it can be driven and controlled by a telemetry system, such as an optical means for determining where and how the parts have been moved and in what location and placement they are to be provided.

The spool 208 upon which the tape is retracted, can also be provided with a guide in front of it so that upon pushing it into the opening 64, it is constantly indexed with the parts guide 136. Suffice it to say, any means for driving the members along the tubular conduits 56 is sufficient.

In addition to the foregoing tape 206, a rod, cable driven hook, actuator, or other linkages can be used to remove the parts from the conduit 56.

As each conduit 56 has its parts removed, the control of the stepping motor actuating the Geneva drive 111 can be provided for purposes of causing a rotation of the driven Geneva member 108. Thusly, the support and drive sprockets 92 can rotate the chain comprising the plurality of conduits 56 into incremental rotational orientation for further unloading or loading of parts along the length thereof.

By way of illustration, a wire bonder 300 has been shown having a bonding head 302 which is operated by a person at station 214. The wire bonder 300 with the operating head 302 has an optical viewer 304 for viewing the work being performed at the head 302. A light 306 is shown for purposes of casting light on the bonder head. The bonder is actuated by means of controls, part of which are shown through a control unit 312. The parts are moved incrementally along the portion of the bonder by means of a motor 314 connected to a chain drive means to be expanded upon hereinafter.

The entire bonder 300 effectuates bonding by means of ultrasonic bonding. However, other processes related to electronic parts can be substituted for the bonding process.

The parts are moved along in a track similar to the tract provided within the conduits 56. Specifically, parts 204 are moved along a surface formed on a pair of tracks 320 and 322. The tracks 320 and 322 have the head 302 placed intermediately therebetween. Each of the tracks bears a continuous chain 324 that moves along them in a continuous manner with the parts 204 thereon. The movement is provided by either operator control at station 214 or by indexing on an automatic basis in whatever manner is deemed appropriate.

The chain 324 comprises a plurality of small spherical members 326 joined by wire links 328. The foregoing chain is analogous to ball and wire chains, such as those used for pulls on light sockets and other flexible chains. Each one of the wire members 328 between the spherical members 326 effectuates a flexible joining so that they can be moved along incrementally in a flexible manner and turned around a capstan or other drive means as they are moved and driven along.

The chain 324 can be moved in any suitable manner or by any drive to move the parts resting thereon therealong. The chain 324 can be a continuous series of links moved in an upper channel 340 and back through a lower channel 342 continuously over the head 302. The head 302 is supported on a base or pedestal 344 that allows for rotational movement. The pedestal or base 344 has a member 346 connected thereon for handling the parts.

The base 344 and the upper portion on the pedestal 346 can be supported in any suitable manner for the rotational movement of a column 350 which supports the head. Regardless of the foregoing, the entire device can be moved in any actuable manner.

An important characteristic to be noted of the device is a pair of solenoid actuating members 360 and 362. The solenoid actuating members move upwardly and downwardly to provide a blocking movement at the upstanding surface areas of the head to prevent any further movement of parts therealong. The solenoids have upstanding arms, respectively 364 and 366 so that they block any parts moving therealong. A slot 368 is provided analogous to the other track members that receive the downwardly depending terminals such as terminals 200 and 202 with the upper surface of the parts 204 lying along the surfaces on either side of the channel 368.

The solenoid members 364 and 366 can be driven and actuated in a spring loaded manner so that they are either in the up position or down position on a spring biased, or electrically actuated basis. Regardless of the foregoing, they serve as a blocking member to prevent the movement of components 204 on the chain 324, as it continues to move.

The head 302 comprises a channel portion 370 having side walls 372 and 374 on either side to provide for the guidance and holding of a component 204 once it has moved therein. As can be seen, the chain 324 moves underneath the channel 370 so that the parts thereon are not constantly subject to movement.

The parts are constantly subject to being ridden along the chain 324. They must be checked by the solenoid ends 364 and 366. To move the parts onto the head 302, since the chain passes within channels thereunder, a pair of fingers 390 and 392 are utilized for purposes of moving the parts toward the right, as seen in FIG. 8. This is effectuated by the fingers 392 being actuated into the down position and then moved by an actuator 396 within the actuator drive box 398. The actuator fingers 392 are moved upwardly and downwardly as shown in the dotted configuration by rotating backwardly on a spindle 400. For purposes of illustration, the finger 392 is shown in the back position in the dotted configuration labeled 393. The fingers move the part 204 onto the head, due to the fact that the part cannot be moved with the underlying chain 324 moving through the channels 370. Thus, the parts are moved onto the head 302, processed, and then moved to the right along the chain 324 for delivery and further conveyance into the cabinet 10 to the right.

In order to move the parts after a certain number has been processed at the head 302, into the tubular members 56 of the cabinet to the right of FIG. 1, a belt 412 is shown connected to two pulleys 414 and 416. The pulleys 414 and 416 drive the belt 412 with a driving ram 418 to the right for purposes of driving the parts into the cabinet. This is effectuated by a drive means controlled through a motor drive or actuator 420 that can be driven incrementally by operator control or after a certain amount of parts are processed. Of course, the number of parts can be controlled and constantly ascertained as to their number by optical encoding means, sensors, or limit switches. Regardless of the foregoing, any suitable means for moving the parts from the track 322 to the right is all that is required. In this manner, the parts can be moved by a tape, an actuator, a pusher, a push ram, a cable with a member, or a belt as shown, or any other suitable means to deliver the parts into the tubular conduit 56 within the cabinet 10 to the right in FIG. 1.

In addition to the foregoing, various means for control can be utilized, including the overall telemetry, through optical means, counters or sensors for determining the number of parts 204 to be moved. Also, direct operator control can be utilized, rather than an automatic feed system. Regardless of the foregoing, it should be understood that this invention has broad application for small parts stored in tubular members and later to be transported within carts and handled or processed in an in-line process. Thus, this invention has broad application and should be read broadly as to the claims hereinafter.

I claim:

1. A parts storage and handling system comprising:
   a container having walls at least partially surrounding said container;
   a plurality of extended elongated tubular conduits in said container having a passage for placement of said parts therein;
   means for connecting said elongated tubular conduits in generally side by side relationship in a manner whereby the side by side relationship creates a continuous belt of links of elongated tubular members in connected relationship for movement in side by side relationship;
   at least one rectangularly formed sprocket for movement in a rotational manner for purposes of driving said tubular conduits; and,
   said tubular conduits having a flattened surface adapted for resting on said sprocket so that upon rotation thereof said sprocket will engage and turn said tubular conduits in their linked and hinged configuration.

2. The handling and storage system as claimed in claim 1 wherein:
   said tubular conduits have a track means therein adapted for said parts for receiving parts for movement therealong.

3. The storage system as claimed in claim 1 wherein:

said tubular conduits are formed from extruded members having ears along the edges thereof for hinging with ears of an adjacent tubular conduit.

4. The system as claimed in claim 1 further comprising:
drive means for connection to said sprocket having a drive member for incremental rotation for purposes of turning said sprocket from one rectangular orientation ninety degrees to another rectangular orientation so that said tubular conduits move over said rectangular sprocket or their respective edges in adjacent relationship to said sprocket in an incrementally fed manner.

5. The system as claimed in claim 4 wherein:
said incremental drive means comprises a Geneva drive movement for rotating said drive incrementally wherein one portion of said Geneva drive movement comprises a driver; and,
said second portion comprises a driven portion that is connected to said drive means connected to said sprockets.

6. The system as claimed in claim 5 wherein:
said drive means connected to said sprockets includes a chain and gear drive.

7. The system as claimed in claim 6 wherein:
said Geneva drive wheel has a series of pins for engaging slots within said wheel that is to be driven; and,
means for incrementally moving said driving wheel.

8. The system as claimed in claim 7 further comprising:
a stepping motor for moving said Geneva driver; and,
means for controlling said stepping motor in the form of electrical controls that control the incremental stepped movement thereof.

9. The system as claimed in claim 8 wherein:
said control means are formed by means of an optical encoding member having reflective optical transmission capability from said driven member.

10. A parts handling system comprising:
a plurality of elongated tubular conduits having passages with a track adapted to receive a plurality of electronic components lying thereon for movement along the length thereof in end to end relationship, said conduits connected in side by side relationship along the elongated portions thereof;
drive means including at least one sprocket upon which said tubular conduits are driven for moving said tubular conduits in their respective side by side relationship in a manner whereby they create a linked series of tubular conduits forming a string of links in continuous relationship for delivering parts to an indexed location;
a support frame for supporting said tubular conduits;
stepped motor means connected to said drive means for moving said tubular conduits incrementally;
external track means for associated indexing with respect to said tubular conduits for movement of parts therealong in their end to end relationship from said tubular conduits along the length of the track within said tubular conduits on which said parts rest; and,
chain means for moving said parts along said external track means.

11. The system as claimed in claim 10 further comprising:
a processing system for processing said parts from said external track means; and,
electromechanical means for moving said parts from said external track means to said processing system.

12. The system as claimed in claim 11 further comprising:
an ultrasonic bonding unit forming said processing system.

13. A process for moving and storing electronic parts comprising:
providing a plurality of tubular elongated conduits having openings passing therethrough which are in side by side hinged relationship;
providing support means upon which said tubular elongated conduits are supported;
indexing said tubular elongated conduits with respect to a delivery point;
providing a track in adjacent relationship to said delivery point;
driving said parts from said tubular conduits outwardly by pushing them end to end toward said delivery point; and,
moving said parts along said track for subsequent processing from said delivery point.

14. The process as claimed in claim 13 further comprising:
combining said storage and removal process with an ultrasonic wire bonding process in adjacent relationship to said track; and,
bonding wires to said parts with said bonding process.

* * * * *